United States Patent [19]

Chao

[11] Patent Number: 4,458,262

[45] Date of Patent: Jul. 3, 1984

[54] CMOS DEVICE WITH ION-IMPLANTED CHANNEL-STOP REGION AND FABRICATION METHOD THEREFOR

[75] Inventor: Robert L. Chao, Sunnyvale, Calif.

[73] Assignee: Supertex, Inc., Sunnyvale, Calif.

[21] Appl. No.: 153,577

[22] Filed: May 27, 1980

[51] Int. Cl.³ .......................................... H01L 29/78
[52] U.S. Cl. .................................. 357/23.11; 357/42; 357/59; 357/53
[58] Field of Search .................. 357/23, 42, 59, 53

[56] References Cited

U.S. PATENT DOCUMENTS

| | | | |
|---|---|---|---|
| 3,806,371 | 4/1974 | Barone | 357/23 |
| 3,855,610 | 12/1974 | Masuda et al. | 357/23 |
| 3,955,210 | 5/1976 | Bhatia et al. | 357/42 |
| 4,011,581 | 3/1977 | Kubo et al. | 357/23 |
| 4,044,452 | 8/1977 | Abbas et al. | 357/23 |
| 4,101,344 | 7/1978 | Kooi et al. | 357/23 |
| 4,217,149 | 8/1980 | Sawazaki | 357/23 |
| 4,268,847 | 5/1981 | Kurakami et al. | 357/23 CS |
| 4,282,647 | 8/1981 | Richman | 357/23 |
| 4,285,116 | 8/1981 | Meguro | 357/23 |
| 4,321,616 | 3/1982 | Bise | 357/23 |

Primary Examiner—Joseph E. Clawson, Jr.

[57] ABSTRACT

Integrated MOS devices with intermediate ion-implanted regions for minimizing device interaction. Several configurations are detailed; they are individually or, in combination, extremely useful in maximizing the density of ROM functions implemented in the integrated circuit format. In particular, one of the embodiments enhances the achievable density in a row-column array used in ROM memories. Used together, the embodiments are especially suited for a ROM of the CMOS genre.

2 Claims, 6 Drawing Figures

CMOS DEVICE WITH ION-IMPLANTED CHANNEL-STOP REGION AND FABRICATION METHOD THEREFOR

BACKGROUND OF THE INVENTION

1. Field of the Invention

This relates generally to MOS devices and fabrication methods therefor and, more particularly, to MOS devices having ion-implanted regions and fabrication methods therefor.

2. Description of the Prior Art

In the past, read-only memories (ROM's) have been implemented in a variety of integrated circuit technology. With the advent of large-scale integrated (LSI) circuits in the MOS format, most prior art ROM's have utilized the N-channel conductivity type devices as opposed to P-channel conductivity type devices because of the increased speed performance possible with the former.

There remains an unfulfilled need for integrated circuit ROM's of lower power consumption. On a theoretical basis, at least, this need may be filled by complementary MOS device ROMs. However, the N-channel device configurations used heretofore in MOS LSI circuits are not viable for the achievement of high density in a row-column array organization of a typical memory.

In order to achieve high density, MOS integrated circuit logic or memory operates at least internally with very low currents in order to achieve small device sizes. The overall size of the integrated circuit, however, is determined not only by the device sizes but also by their packing density. If very low current devices are placed extremely close to each other, the possibility for interaction due to common conduction paths is increased. While there are many known techniques for minimizing or virtually eliminating inter-device interactions which result in false signals, these known techniques consume excessive space in a memory array and, hence, increase the size of the circuit and decrease the yield.

SUMMARY OF THE INVENTION

It is the object of the present invention to increase the packing density of MOS devices by techniques which do not detract from the overall yield of the circuit.

It is a further object of the present invention to maximize the packing density in row-column arrays suitable for MOS memory devices.

It is yet another object of the invention to provide a method of making MOS ROMs by a simplified masking sequence.

It is yet still another purpose of the invention to provide MOS devices for a CMOS ROM wherein the means for reducing the interactions of the devices in the memory array can simultaneously enhance the performance of the complementary devices associated therewith.

It is yet another object of the instant invention to provide means for reducing the interaction between adjacent complementary devices which may result in circuit failure due to a latching action.

In order to achieve these as well as other objects, ion-implanted regions are provided intermediate to potentially interacting devices. In some cases, these intermediate ion-implanted areas are contiguous with the channel regions of the respective devices. In yet other instances, the intermediate ion-implanted regions are intermediate but remote from the channel regions of the respective MOS devices.

An MOS device typically comprises a thin insulating layer over its channel region; this thin insulating layer is overlaid by conductive gate means for controlling the channel conductivity. In a typical embodiment, the regions adjacent to the gate of the device are covered by a field insulator which is substantially thicker than the thin gate insulator in order to reduce the field which induces a stray channel peripheral to the desired MOS device. The amount of the stray channel current cannot be reduced arbitrarily because it is determined by the values of the thin and thick insulator thicknesses which are ordinarily limited in practice by the thickness ratio of the insulators necessary to achieve good yields. While it is known to reduce or eliminate such stray paths by the use of channel-stop regions opposite in conductivity to that of the desired channel, when these regions are remote from the channel region of the desired device, they require an unwarranted amount of space. When such channel-stop regions are immediately adjacent to both the channel and the source drain regions of the desired MOS device, they may undesirably reduce the breakdown voltage of the device and they have the further disadvantage that, since the channel-stop regions and the gate regions are ordinarily formed in two different process steps, mutual alignment is difficult to achieve. In a preferred embodiment of the instant invention, the above problems are overcome by extending the thin gate insulator to the peripheral regions of the device. After the gate conductor has been formed and patterned over only a portion of the gate insulator, ion-implantation is used to provide channel-stop regions which are self-aligned contiguous with the desired channel by virtue of the fact that the ion-implantation process is masked by the patterned gate conductor and the field insulator. In a preferred sequence, a thin insulating region is formed to include both the desired channel region and the peripheral regions flanked therewith. This obviates the need for a separate patterning step to form the channel-stop regions proximate to the desired device.

In the above-described sequence, the gate conductor is formed and patterned completely separately from the source and drain regions. This sequence precludes the self-alignment of the source and drain to the gate which is achieved by typical MOS LSI processes. Where the integrated circuit array comprises both N-channel and P-channel devices, however, this disadvantage is at least partially obviated by the possibility of using the channel-stop ion-implantation for one conductivity type in order to provide self-aligned source/drain regions in the device of opposite channel conductivity type. Additionally, where the device is a first-channel conductivity type or employed in a row-column array memory having alternating rows of continuous source or drain regions providing both the sorce-drain function and an interconnection function and columns of gate conductors providing both the gate function and an interconnection function, the necessity for individual gate to source or drain self-alignment in the matrix is obviated. Thus, effective simultaneous self-alignment of gate to source and drain is achieved in both the matrix regions of the integrated circuit comprising devices of a single-channel conductivity type and, in complementary devices remote from the matrix.

In yet another embodiment of the instant invention, intermediate ion-implanted regions are used to minimize the interaction between higher current MOS devices which serve, for example, as input/output devices to connect with external circuitry. A CMOS device pair inherently contains a bipolar transistor which can interact with the drain of an adjacent device so that the pair remains in the conducting state as a result of latch-up. As a result of this four-layer interaction, the pair then is rendered useless in terms of its desired circuit function. Latch-up is ordinarily more of a problem at higher currents because bipolar transistor gains increase with current. In order to reduce the tendency for the higher current device pairs to latch-up, the instant invention contemplates the inclusion of an implanted region between the two complementary devices in such a way that the overall gain of the parasitic four-layer device is reduced.

The above embodiments of the instant invention are more fully described in the following detailed description and drawings associated therewith.

DESCRIPTION OF THE PREFERRED EMBODIMENT

Figure 1A:
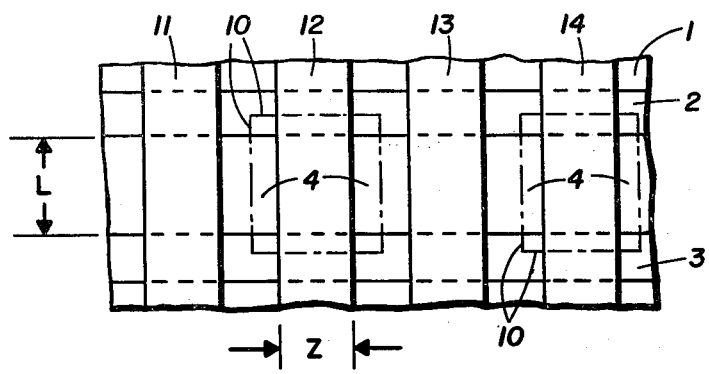
FIG. 1A is a top view of a portion of a memory array employing a preferred embodiment of the instant invention.

FIG. 1A is a top view of a portion of an MOS memory matrix utilizing one of the preferred embodiments of the present invention. This figure shows four of a multiplicity of MOS devices arranged in rows and columns to form an MOS memory matrix. Four devices along one row are shown; the array is repetitive in both directions. Region 1 is a semiconductor substrate region of first conductivity type which serves as a common element for all of the MOS devices. Region 2 is a semiconductor region of second conductivity type opposite said first conductivity type and extending in the row direction of the matrix. Region 3 is essentially identical to the region 2; either region 2 or 3 may form a common source for each of the four MOS devices while the other of the regions 2 and 3 form a common drain. Regions 2 and 3, which are relatively heavily doped, serve as both the sources or drains of the MOS devices as well as conductive interconnections between the common sources and drains. All of the semiconductor regions 1, 2, and 3 are covered by an insulating layer which isolates the conductive means comprising stripes 11, 12, 13, and 14 over the channel between each source and drain which serve as gates for controlling the channel current. The sources and drains are thus all parallel with a first direction in the circuit and the conductive means over the channel regions are parallel with a second direction perpendicular to the first direction.

To achieve a ROM function, certain preselected MOS devices in the array must conduct relatively more current than others of such devices. In the embodiment shown in FIG. 1A, this differential current carrying capability is made to occur by providing a thin insulating layer in regions bounded by 10 underlying the gates, for example, 12 and 14 of two out of the four devices. Thus, when the potential is applied between source and drain semiconductor regions 2 and 3 and gate voltages are applied on gate conductor columns 11, 12, 13, and 14, the MOS devices comprising the thin insulating layers conduct relatively more than those comprising the insulating layers because the field normal to the plane of the drawing is relatively greater for the thin insulator devices. Hence, a greater local current flows between the source and drain elements of these devices than of the thick insulator devices.

In order to achieve the desired memory function, a thin insulator device adjacent to a thick insulator device must not be turned on when the gate voltage is only applied to the thick insulator device. For example, in FIG. 1A if the potential on gate line 11 is such as to induce a conducting channel between the source/drain regions 2 and 3 beneath the conductive layer 11 (if the conductor overlaid a thin gate insulating region) while the potential on gate line 12 is such as to preclude the formation of such conducting channel, then any stray fields from the gate line 11 which induce a conducting channel in the thin oxide region bounded by 10 of the MOS device under gate line 12 will give a false indication that the thick insulator device under gate line 11 is on when, in fact, little current is carried by that device. In this embodiment, such extrinsic or parasitic induction is reduced by the ion-implanting impurities of first conductivity type into the top surface of the device. By selecting ions of appropriate energy, they can be made to penetrate through the thin gate insulator region bounded by 10 into the regions 1, 2, and 3 of the semiconductor substrate. The thicker gate insulator under the desired off devices as well as the conductive gate lines 12 and 14 stop such a high percentage of the incoming ions that there is substantially no implantation nor effect in the semiconductor substrate in regions under the thicker insulator or under the gates. Thus, the channel-stop region 4 is contiguous with the channel of the device.

Figure 1B:
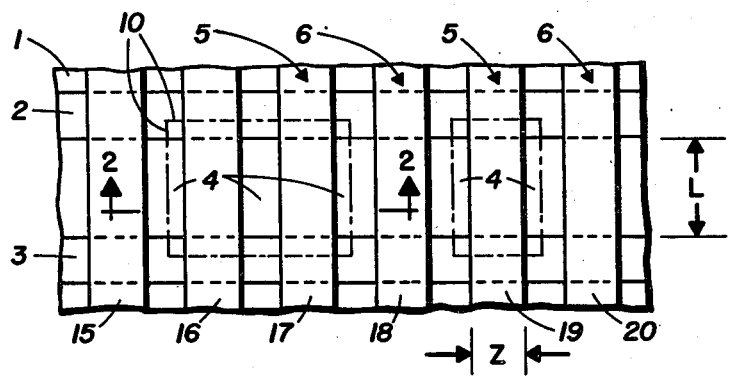
FIG. 1B is a variation of the embodiment of FIG. 1A which is useful in achieving increased device density in a memory matrix.

FIG. 1B shows an alternative embodiment of the preferred memory embodiment wherein the gate lines consist of alternating columns 5 and 6 of two different materials. This may be seen in more detail in FIG. 2 which is a cross-section of FIG. 1B gate conductor 6, for example, may be of polycrystalline polysilicon while gate conductor 5 may be formed of metal such as aluminum. This is advantageous because, if after formation of the gate column 6 of polycrystalline silicon, the polycrystalline silicon is oxidized in order to form a thin insulating layer on its top and sides, then gate columns 5 of metal may be formed in close proximity to column 6 without the risk of obtaining shorts between the two adjacent columns. In this way, a considerably higher density of devices along a row may be achieved. For example, FIG. 1B shows gate columns 15, 16, 17, 18, 19, and 20 occupying approximately the same space as the gate columns 11, 12, 13, and 14 of FIG. 1A. As may be further seen in FIG. 2, the insulating layer 9, which is thicker than insulating layer 8, forms one lateral boundary 10 of the ion-implanted channel stoppers of P-channel conductivity type the same as that of substrate 1. In this Figure, the substrate has P- conductivity type; this is only illustrative of the invention and either conductivity type could be used to provide devices of desired channel conductivity type opposite to the substrate conductivity type. Gate conductors 5 and 6 patterned to form gate columns 15, 16, 17, 18, 19, and 20 form the other lateral boundaries of regions of the ion-implanted channel regions 4. The thin insulating layer 8 is approximately 800 angstroms thick and is desirably made of silicon dioxide. The thicker field insulating layer 9, also desirably made of silicon dioxide, is approximately 8,000 angstroms thick. As may be seen clearly in FIG. 2, a conducting channel into the plane of the drawing is bounded by the ion-implanted channel stop region 4. Thus, if the potential under gate column 16 and 17 is such that the conduction in the corresponding MOS devices is desirably zero, a conducting channel inducing potential on either or both of gate lines 15 or 18 channel will not induce a stray channel in either of the MOS devices under gate regions 16 and 17.

Figure 2:
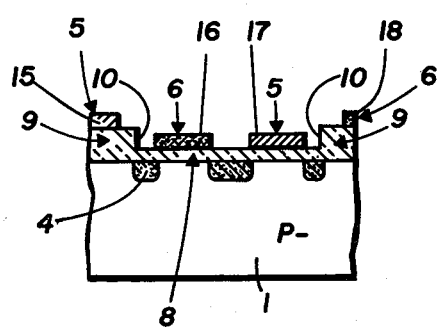
FIG. 2 is a cross-sectional view of FIG. 1B showing the details of the construction thereof; this figure is also illustrative of the embodiment shown in FIG. 1A.

In addition to the density advantages illustrated by FIGS. 1A and 1B and FIG. 2, the configurations illustrated therein are highly desirable from the standpoint of simplified processing. That is, the preselected thin oxide regions bounded by 10 constitute the only process difference between the desirably on and the desirably off MOS devices. Thus, the ROM function that is achieved by using a mask corresponding to the preselected conduction pattern at only one step of the process. If the channel-stop regions were not self-aligned by virtue of the thin oxide regions bounded by 10, then either another mask would be required to put the channel-stop regions adjacent to the desired conducting devices, or all the devices would have to have channel-stop regions formed by another pattern which would require much more space than that needed by the method of the present invention.

The most common MOS LSI integrated circuits today are formed by using polycrystalline silicon gates with the individual sources and drains of each device self-aligned to the gates by means of a doping step which is masked by the gates and their underlying oxides. This technique achieves minimum geometry devices in terms of a channel length L depicted in FIG. 1A. However, in the memory matrix application shown in FIGS. 1A and 1B, it is seen that the self-alignment feature is not required even when a metal gate such as 11 or 12, in FIG. 1A, or 13, 15, 17, and 19, in FIG. 1B, are utilized. Where complementary devices are required in the same circuit, however, the use of metal gates that require their alignment to the source and drain region by means of two separate masking steps which, due to tolerances, increases the length L between the sources and drains of the devices.

Figure 3:
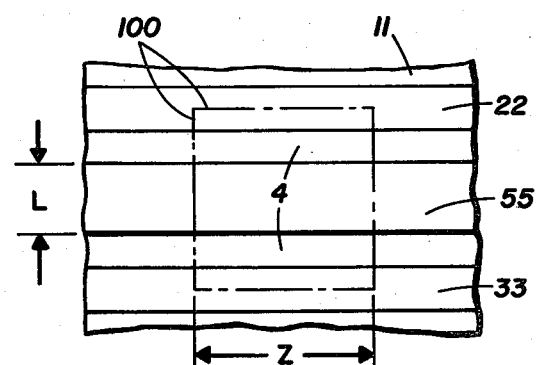
FIG. 3 is a top view of a complementary transistor suitable for use with the devices shown in FIGS. 1A and 1B and which makes use of an ion-implanted region formed simultaneously in both devices.

FIG. 3 shows how this undesired characteristic may be obviated using an ion-implantation step common with that used to form the channel stoppers in FIGS. 1A, 1B, and 2. Here, 11 is the local substrate region for the complementary device which comprises source 22 and drain 23 of semiconductor conductivity type opposite to the local substrate 11. 55 is a gate region located between regions 22 and 23. In order to achieve channel conduction between regions 22 and 23 underneath gate 55, the latter would ordinarily have to cover the entire insulating layer between regions 22 and 33. Because regions 22 and 33, and region 55, are formed in different masking operations, the tolerances dictated by this requirement would unnecessarily increase the size of the device. The length L can be minimized, however, by the embodiment shown in FIG. 3. Here, a thin insulating region bounded by lines 100 is again used to permit the implantation of an impurity in regions 4. However, the same impurity is used as formed the channel stops for the memory matrix devices and, hence, the implantations may be simultaneous. This impurity is opposite to the conductivity type of the localized substrate 11 of FIG. 3 and, hence, of the same conductivity type as the source and drain regions 22 and 23, and thus, acts to form local extensions or castellations of these regions of the source/drain regions in the area between them and the gate that is bounded by the lines 100. Thus, the source and drain are exactly aligned with the gate allowing a minimum gate width L determined only by the minimum line width that can be achieved in defining gate 55.

Figure 4:
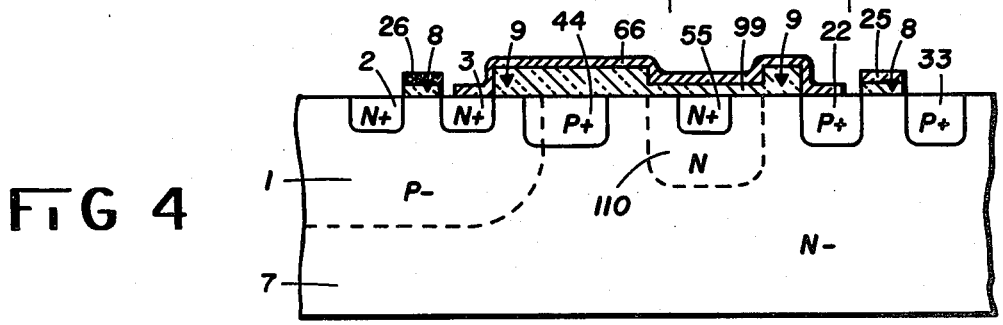
FIG. 4 is a cross-sectional view of a pair of complementary MOS devices showing how an intermediate ion-implanted region is located in order to minimize device interaction.

FIG. 4 illustrates another embodiment of the instant invention. Here, the adjacent transistors, unlike those in FIGS. 1 and 2, are opposite or complementary channel conductivity type. An N-channel MOS device comprises source region 2, drain region 3, thin-gate insulator region 8, and gate region 26. P-channel device comprises source region 33, drain region 22, and thin-gate insulator region 8. The drain 3 of the N-channel device and the drain 22 of the P-channel device are interconnected by means of the conductive means 66 which lies over thicker insulator region 9. Region 44 formed at the same time as the P+ source and drain regions 22 and 33 serves as a channel stop to preclude any unwanted conduction across the surface in the inter-device region. Likewise, N+ region 55 formed at the same time as N+ source and drain regions 2 and 3 serves to enhance the surface of the N− substrate 7 and further precludes unwanted surface currents.

However, even if the unwanted surface currents are obviated by the channel-stop regions 44 and 55, another type of conduction may take place in the complementary pair of devices shown in FIG. 4. This comes about because there is an NPN transistor formed by N+ region 2 acting as an emitter; P- region 1 acting as a base and N− region 7 acting as a collector. This parasitic bipolar transistor merges with a parasitic bipolar transistor formed by P+ region 22 acting as an emitter N− region acting as a base and P+ region 44 and P− region 1 acting together as a collector. When the sum of the current gains of the two devices exceeds unity, the ability to block current between region 22, the drain of the P channel MOS device and region to the source of the N channel MOS device is lost. This effect is particularly troublesome where the MOS devices must carry relatively high currents because the current gain of most bipolar transistors increases with current in the high current range. The gain of the parasitic PNP transistor is reduced to some extent by the channel-stopper region 55 which introduces extra impurities into the base region 7. However, it is still possible for carriers injected from P+ region 22 into N− region 7 to reach the composite collector 1 and 44 by flowing underneath channel-stopper region 55. In order to further prevent unwanted transport of injected carriers across base region 7, N region 110 is provided in the base of the parasitic PNP transistor. As in the previous embodiments, this base may be implanted through a thin oxide and, hence, serve multiple functions such as a channel stopper described in the previous embodiments. Space is best conserved by locating the N region 110 in at the same site as N+ channel stopper 55; current gain is best reduced if the N-region extends substantially below N+ channel stopper 55. The implanted region 110 of the same conductivity type as the drain of the N-channel transistor is remote from the drain 2 unlike the configurations of FIG. 1; the carrier doping in region 110 is higher than the doping in the channel region underneath the gate 25 of the P-channel device.

Figure 4A:
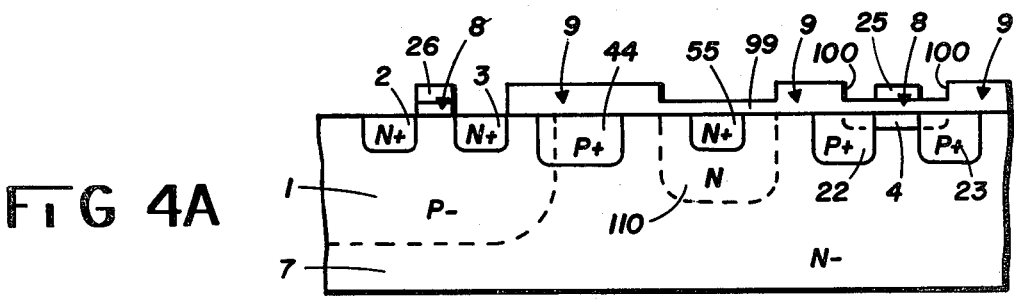
FIG. 4A is an alternative embodiment of FIG. 4.

FIG. 4A shows an alternative embodiment of the device pair just described. Here the P-channel transistor comprising source 33, drain 22, gate insulator 8, and gate 25 contains a conducting channel 4 formed by the same ion-implantation used to form the channel stops for the N-channel transistors hereinbefore described. The lightly-doped P-type region 4 comprises a conducting channel for the device if the implantation penetrates both the thin insulating layer 8 and gate 25, or if the implantation is carried out prior to the formation of the gate 25. As yet another alternative, the P-channel device may be similar to the P-channel device of FIG. 3; in that case the ion-implantation fails to penetrate beneath the gate 25 so that the source and drain regions are effectively self-aligned with the gate.

While the invention has been particularly described and illustrated in terms of the foregoing embodiments and applications thereof, it will be apparent to one skilled in the art that the concepts illustrated thereby are not limited to the envisioned specific applications envisioned. The ion-implanted channel stopper regions illustrated in FIGS. 1 and 2 are perhaps applicable to other repetitive device structures such as charge coupled devices. Such regions could also be used in a discrete device to accurately define the channel region. The simultaneous implantation of each of two complementary transistors form channel stoppers in the first and self-aligned source drains in the second applications in many CMOS integrated circuits. The embodiment illustrated by FIG. 4 is useful whether or not the conductor 66 interconnects the drains of the two devices; in fact, the configuration is useful wherever two CMOS devices are in proximity and prone to latch-up. Thus, the invention is not limited by the foregoing description but rather as well by the following claims.

What is claimed is:
1. A MOS integrated circuit comprising, in combination:
   a substrate region of a relatively low doping level of a first conductivity type;
   a first region of a second conductivity type opposite said first conductivity type in said substrate;
   a first MOS device comprising a source and a drain of said first conductivity type and a channel region extending between said source and drain, said first MOS device located in said first region of said second conductivity type;
   a second MOS device comprising a source and a drain of said second conductivity type and a channel region extending between said source and drain, said second MOS device located in said substrate;
   a further region of said first conductivity type and having higher doping than said substrate but lower doping than the doping concentration in said source or drain region of said first MOS device located in said substrate intermediate said first and said second MOS devices;
   a second region of said first conductivity type located within said further region of said first conductivity type, said second region of said first conductivity type having the same doping concentration and depth as said source and drain regions of said first MOS device;
   a first thin oxide region located over said further region and said channel regions;
   a second oxide region having a larger thickness than said first oxide region located over another portion of said substrate; and
   conductive means for interconnecting said first and said second MOS devices, said conductive means lying over both said first oxide region over said further region and said second oxide region.
2. The MOS integrated circuit of claim 1, further including a second region of said second conductivity type located in said substrate and partially in said first region of said second conductivity type, said second region of said second conductivity type having the same doping concentration and depth as said source and drain regions of said second MOS device.

* * * * *